United States Patent
Takita et al.

(10) Patent No.: US 12,310,131 B2
(45) Date of Patent: May 20, 2025

(54) PHOTOELECTRIC CONVERSION PANEL

(71) Applicant: Sharp Display Technology Corporation, Kameyama (JP)

(72) Inventors: Rikiya Takita, Kameyama (JP);
Fumiki Nakano, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 560 days.

(21) Appl. No.: 17/717,613

(22) Filed: Apr. 11, 2022

(65) Prior Publication Data

US 2022/0367544 A1      Nov. 17, 2022

(30) Foreign Application Priority Data

May 11, 2021   (JP) ................. 2021-080249

(51) Int. Cl.
*H10F 39/00*    (2025.01)
*H10F 30/29*    (2025.01)

(52) U.S. Cl.
CPC ....... *H10F 39/8037* (2025.01); *H10F 39/802* (2025.01); *H10F 30/29* (2025.01)

(58) Field of Classification Search
CPC ......... H01L 27/14612; H01L 27/14603; H01L 31/115; H10F 39/8037; H10F 39/802; H10F 30/29

See application file for complete search history.

(56) References Cited

U.S. PATENT DOCUMENTS

| | | | | |
|---|---|---|---|---|
| 5,565,692 | A | * 10/1996 | Michon | ............... H01L 27/0266 257/77 |
| 2009/0302202 | A1 | * 12/2009 | Sato | ................. H01L 27/14603 250/370.08 |
| 2011/0291195 | A1 | * 12/2011 | Lin | ................. H03K 19/09487 257/355 |

FOREIGN PATENT DOCUMENTS

JP       2009-302092 A    12/2009

* cited by examiner

*Primary Examiner* — Sitaramarao S Yechuri

(74) *Attorney, Agent, or Firm* — ScienBiziP, P.C.

(57) ABSTRACT

A photoelectric conversion panel includes: a substrate; a gate line and a data line formed on the substrate; a pixel transistor connected to the gate line and the data line; a photoelectric conversion element connected to the pixel transistor; an electro-static-discharge protection circuit formed on the substrate and connected to a ground; a depletion transistor for protection connected between either the gate line or the data line and the electro-static-discharge protection circuit; and an interrupting voltage supply line configured to apply an interrupting voltage to a gate electrode of the depletion transistor for protection.

4 Claims, 3 Drawing Sheets

PHOTOELECTRIC CONVERSION PANEL

CROSS-REFERENCE TO RELATED APPLICATION

The present application claims priority from Japanese Application JP2021-080249, the content of which is hereby incorporated by reference into this application.

BACKGROUND OF THE INVENTION

1. Field of the Invention

The present disclosure relates to a photoelectric conversion panel.

2. Description of the Related Art

A known photoelectric conversion panel known in the art includes an electro-static-discharge protection circuit. Such a photoelectric conversion panel is disclosed in, for example, Japanese Unexamined Patent Application Publication No. 2009-302092.

SUMMARY OF THE INVENTION

The photoelectric conversion panel of a solid-state imaging device according to Japanese Unexamined Patent Application Publication No. 2009-302092 includes a pixel, a scan line, a data line, an electro-static-discharge-protection constant potential line, a bias line, and a protection diode, all of which are formed on a base substrate. This protection diode is connected to the electro-static-discharge-protection constant potential line and the bias line. Moreover, the protection diode includes a semiconductor film made of an amorphous silicon film. Furthermore, the protection diode includes two diodes. Of each diode, the drain electrode or the source electrode is connected to the gate electrode. The two diode are inversely connected parallel to each other.

Even if electro-static discharge enters the scan line and the data line during production of the photoelectric conversion panel according to Japanese Unexamined Patent Application Publication No. 2009-302092, the protection diode dissipates a current caused by the electro-static discharge in the electro-static-discharge-protection constant potential line, and prevents breakdown of an element in the pixel. However, when the photoelectric conversion panel according to Japanese Unexamined Patent Application Publication No. 2009-302092 is used in the solid-state imaging device for obtaining an image, a signal running in the scan line and the data line partially leaks through the protection diode into the electro-static-discharge-protection constant potential line. Such a leak might affect a result of the imaging.

The present disclosure is conceived in view of the above problem, and intended to provide a photoelectric conversion panel capable of preventing breakdown of an element in a pixel by electro-static discharge during production of the photoelectric conversion panel, and of reducing influence on a result of image obtainment while the image is obtained.

In order to solve the above problem, a photoelectric conversion panel according to a first aspect of the present disclosure includes: a substrate; a gate line and a data line formed on the substrate; a pixel transistor connected to the gate line and the data line; a photoelectric conversion element connected to the pixel transistor; an electro-static-discharge protection circuit formed on the substrate and connected to a ground; a depletion transistor for protection connected between either the gate line or the data line and the electro-static-discharge protection circuit; and an interrupting voltage supply line configured to apply an interrupting voltage to a gate electrode of the depletion transistor for protection.

In the above photoelectric conversion panel, a depletion thin-film transistor for protection and an electro-static-discharge protection circuit can prevent an element in a pixel from breaking down by electro-static discharge during the production of the photoelectric conversion panel. In obtaining an image, an interrupting voltage is applied to the depletion thin-film transistor for protection. Hence, the depletion thin-film transistor for protection can block a signal from a gate line or a data line not to enter the electro-static-discharge protection circuit, thereby contributing to a reduction in influence on a result of obtaining the image.

DETAILED DESCRIPTION OF THE INVENTION

Figure 1:
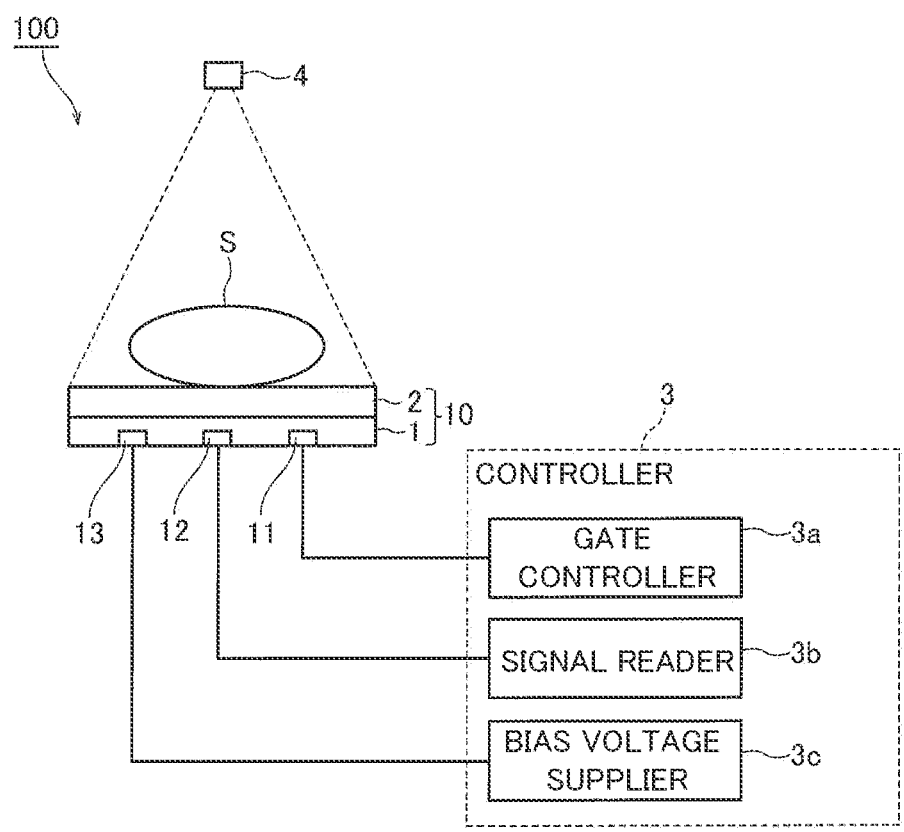
FIG. 1 is a diagram illustrating a schematic configuration of an X-ray imaging device according to an embodiment.

Described below is an embodiment of the present disclosure, with reference to the drawings. Note that the present disclosure shall not be limited to the embodiment below, and the design presented in the embodiment can be appropriately modified within a scope of the configuration of the present disclosure. Moreover, identical reference signs are used to denote identical or substantially identical components among the drawings. Such components will not be repeatedly elaborated upon. Furthermore, the configurations described in the embodiment and in a modification thereof may be appropriately combined or modified unless otherwise departing from the scope of the present disclosure. For the sake of convenience, the drawings below are simplistically or schematically illustrated. In the drawings, some of the constituent members may be omitted. In addition, the dimensional ratios between the constituent members in the drawings are not necessarily the actual dimensional ratios.

[Configuration of X-Ray Imaging Device (Photoelectric Conversion Panel)]

FIG. 1 is a schematic view of an X-ray imaging device 100 including an X-ray imaging panel 10 including a photoelectric conversion panel 1 according to this embodiment. The X-ray imaging device 100 includes: the X-ray imaging panel 10 including the photoelectric conversion panel 1 and a scintillator 2; a controller 3; and an X-ray source 4. The controller 3 includes: a gate controller 3a; a signal reader 3b; and a bias voltage supplier 3c. The gate controller 3a is connected to a gate terminal 11 of the photoelectric conversion panel 1. Moreover, the signal reader 3b is connected to a data terminal 12. The bias voltage supplier 3c is connected to a bias terminal 13.

The X-ray source 4 emits an X-ray to a subject S. The X-ray passing through the subject S is converted into fluorescent light (hereinafter scintillation light) with the scintillator 2 disposed above the photoelectric conversion panel 1. The X-ray imaging device 100 captures an image of the scintillation light with the X-ray imaging panel 10 to obtain an X-ray image using the controller 3.

Figure 2:
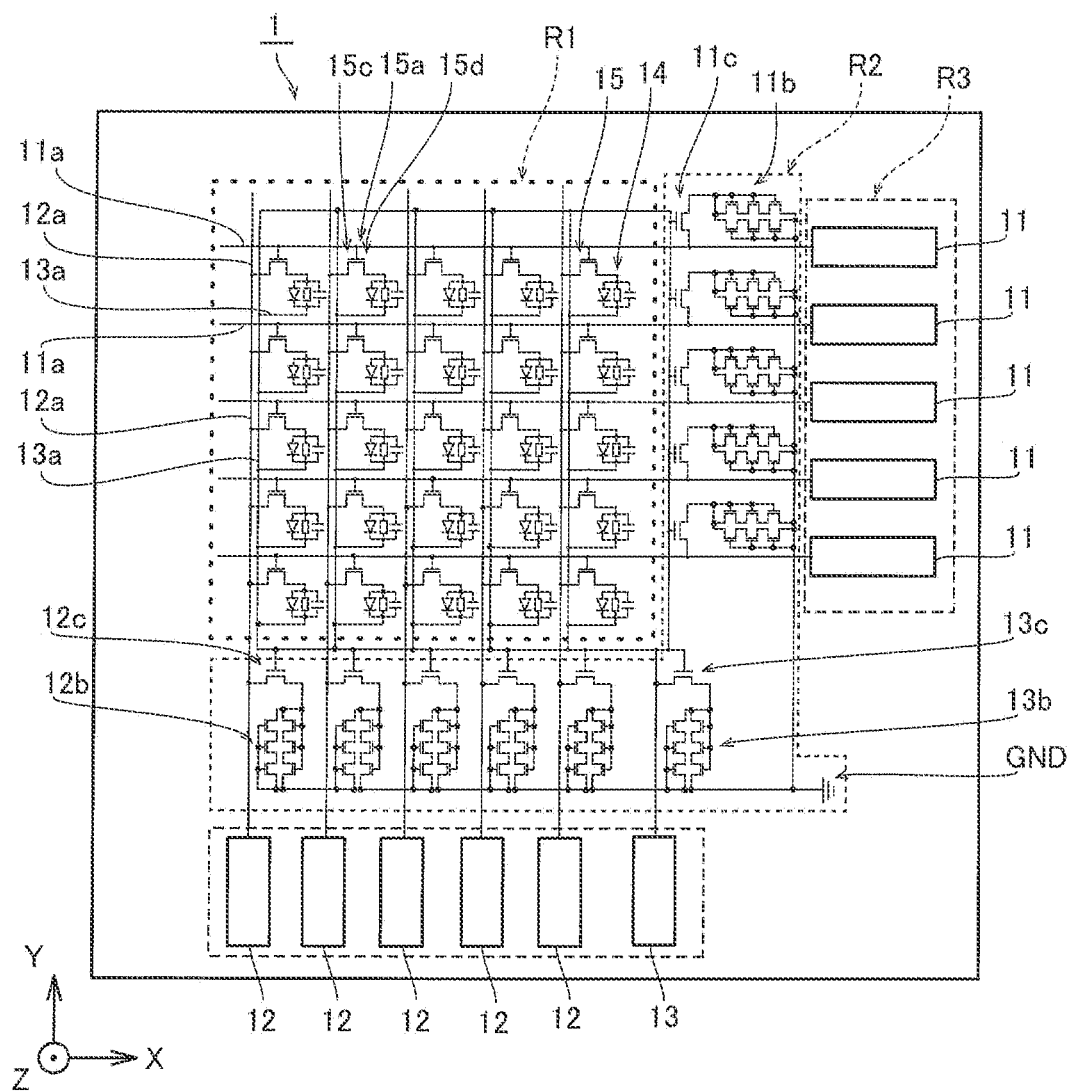
FIG. 2 is a schematic plan view of a configuration of a photoelectric conversion panel.

FIG. 2 is a schematic view of a configuration of the photoelectric conversion panel 1. The photoelectric conversion panel 1 includes: a plurality of the gate terminals 11; a plurality of the data terminals 12; the bias terminal 13; photo diodes 14; and thin-film transistors 15 for pixels. Moreover, formed on a glass substrate 101 (see FIG. 4) of the photoelectric conversion panel 1 are: a plurality of gate lines 11a connecting gate electrodes 15a of the TFTs 15 to the gate terminals 11; a plurality of data lines 12a connecting source electrodes 15c of the TFTs 15 to the data terminals 12; and a bias line 13a connected to the photodiodes 14. Furthermore, the photoelectric conversion panel 1 includes: first protection circuits 11b; second protection circuits 12b; and a third protection circuit 13b. The first protection circuits 11b, the second protection circuits 12b, and the third protection circuit 13b are connected to the ground.

Here, in this embodiment, the photoelectric conversion panel 1 includes: depletion thin-film transistors 11c for protection (hereinafter referred to as the "TFTs 11c") connected to the gate lines 11a and the first protection circuits 11b; depletion thin-film transistors 12c for protection (hereinafter referred to as the "TFTs 12c") connected to the data lines 12a and the second protection circuits 12b; and a depletion thin-film transistor 13c for protection (hereinafter referred to as the "TFT 13c") connected to the bias line 13a and the third protection circuit 13b. Gate electrodes of the TFTs 11c, 12c, and 13c are connected to the bias line 13a. Hence, in a period in which a bias voltage is not applied to each of the TFTs 11c, 12c, and 13c, using the bias line 13a, the TFTs 11c, 12c, and 13c are electrically conductive thereacross. Whereas, in a period in which the bias voltage is applied when the X-ray imaging device 100 obtains an image, the TFTs 11c, 12c, and 13c are not electrically conductive thereacross. That is, the bias voltage acts as an interrupting voltage of the TFTs 11c, 12c, and 13c, and the bias line 13a acts as an interrupting voltage supply line.

The TFTs 11c and 12c, the first protection circuits 11b, and the second protection circuits 12b have an electro-static discharge (ESD) protection function for the TFTs 15. The TFTs 13c and the third protection circuit 13b have an electro-static discharge (ESD) protection function for the photodiodes 14.

Thanks to the above configuration, the TFTs 11c, 12c, and 13c, the first protection circuits 11b, the second protection circuits 12b, and the third protection circuit 13b can prevent breakdown of TFTs 15 and the photodiodes 14 in the pixels caused by the electro-static discharge during the production. In obtaining an image, the bias voltage (the interrupting voltage) is applied to the TFTs 11c, 12c, and 13c. The bias voltage blocks a current from the gate lines 11a or the data lines 12a to the first protection circuits 11b, the second protection circuits 12b, and the third protection circuit 13b. Such a feature can reduce influence on a result of image obtainment. Moreover, the bias line 13a, which is already available, is used as the interrupting voltage supply line. Such a feature eliminates the need of a new line to be formed for application of an interrupting voltage to the gate electrodes of the TFTs 11c, 12c, and 13c. Furthermore, the bias voltage to be applied to the bias line 13a can be used as the interrupting voltage. Such a feature eliminates the need of a new power source circuit to be provided to supply the interrupting voltage.

The photoelectric conversion panel 1 is provided with: a pixel region R1 (an active region); a protection circuit region R2; and a terminal region R3. In plan view, the pixel region R1 is, for example, rectangular. In plan view, the protection circuit region R2 is provided to partially surround an exterior of the pixel region R1. The protection circuit region R2 is provided between the pixel region R1 and the terminal region R3.

<Pixel Region>

As illustrated in FIG. 2, the pixel region R1 includes the gate lines 11a and the data lines 12a formed to intersect with one another. Moreover, a plurality of the bias lines 13a are formed along, for example, the data lines 12a. In the pixel region R1, each of regions (pixels) surrounded by the intersecting gate lines 11a and data lines 12a is provided with a photodiode 14 and a TFT 15. The photodiode 14 converts an X-ray passing through the subject S into charges, depending on the amount of the scintillation light converted by the scintillator.

<Protection Circuit Region>

As illustrated in FIG. 2, the protection circuit region R2 includes: the TFTs 11c; the TFTs 12c; the TFT 13c; the first protection circuits 11b; the second protection circuits 12b; and the third protection circuit 13b. The TFTs 11c are arranged in a Y-direction. The TFTs 12c and the TFT 13c are arranged in an X-direction. The first protection circuits 11b are arranged in the Y-direction. The second protection circuits 12b and the third protection circuit 13b are arranged in the X-direction. Moreover, the TFTs 11c are arranged between the first protection circuits 11b and the pixel region R1 in plan view. The TFTs 12c are arranged between the second protection circuits 12b and the pixel region R1 in plan view. The TFT 13c is disposed between the third protection circuit 13b and the pixel region R1 in plan view. Such a feature can reduce the size of the photoelectric conversion panel 1, compared with a case where the TFTs 11c, the TFTs 12c, and the TFT 13c are arranged outside the terminal region R3 with respect to the pixel region R1.

Figure 3:
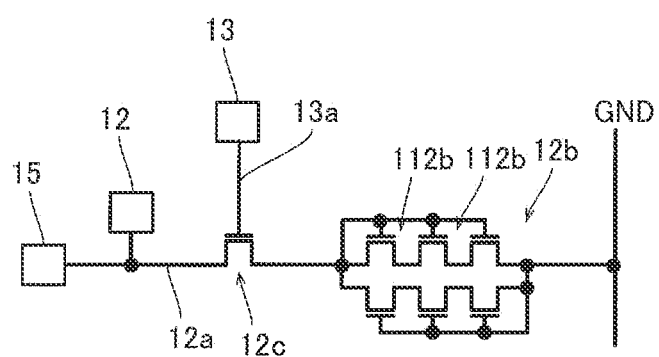
FIG. 3 is a circuit diagram illustrating a configuration of a TFT and a second protection circuit.

FIG. 3 is a circuit diagram illustrating a configuration of a portion of the protection circuit region R2. As illustrated in FIG. 3, each second protection circuit 12b includes a plurality of depletion thin-film transistors 112b (hereinafter referred to as "TFTs 112b"). Here, in a region near the depletion thin-film transistors, it is difficult to form thin-film transistors other than the depletion thin-film transistors. According to the above configuration, the TFT 12c and the TFTs 112b included in the second protection circuit 12b are formed as depletion TFTs. Hence, the TFT 12c and the TFTs 112b can be formed close to each other. Such a feature can reduce the size of the photoelectric conversion panel 1 in which the TFT 12c and the TFTs 112b are formed.

<Terminal Region R3>

As illustrated in FIG. 2, the terminal region R3 is provided with: the gate terminals 11; the data terminals 12; and the bias terminal 13. The gate terminals 11 are arranged in the Y-direction. The data terminals 12 and the bias terminal 13 are arranged in the X-direction.

<Configuration of Photodiode>

Figure 4:
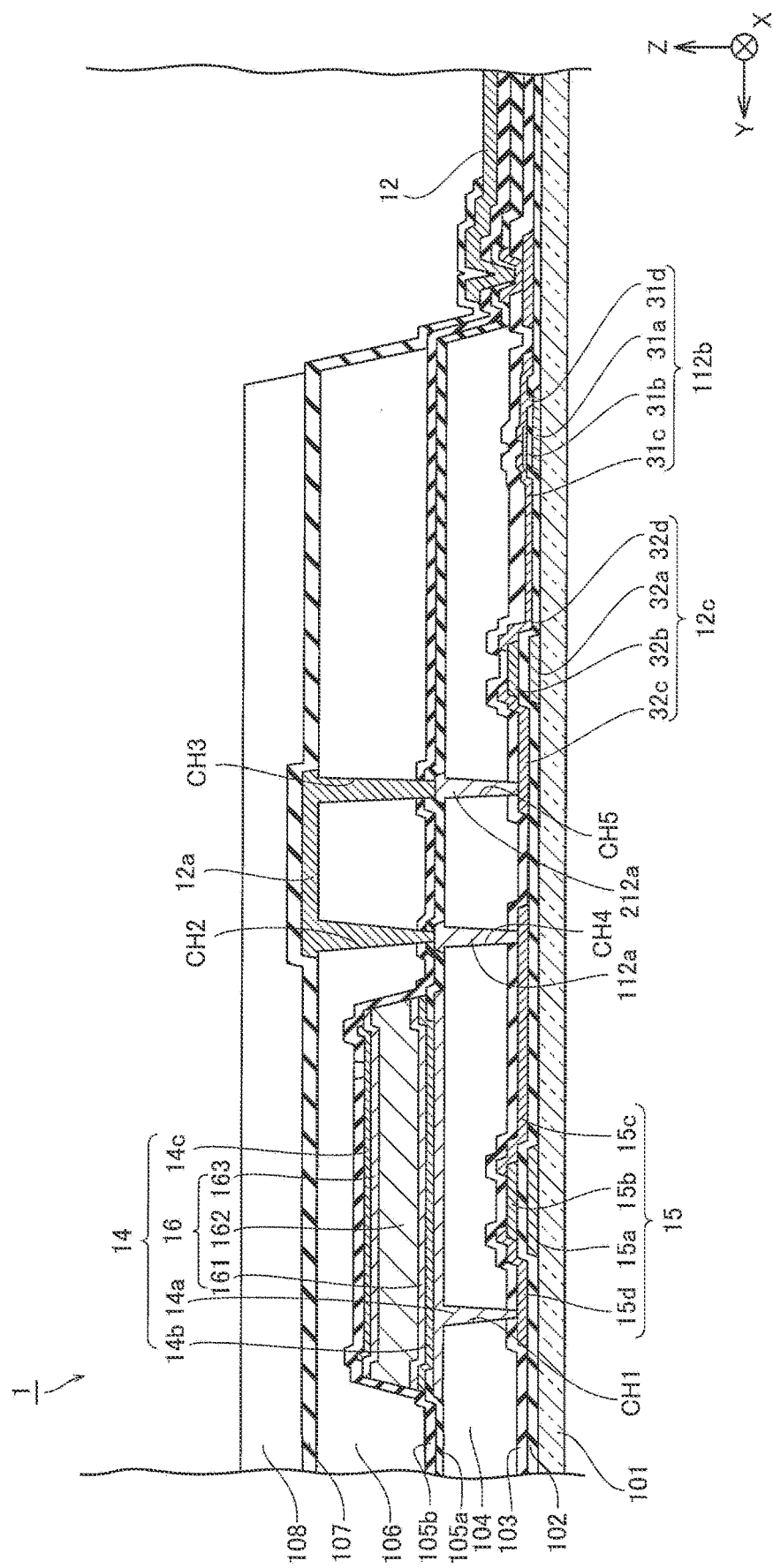
FIG. 4 is a cross-sectional view of a configuration of a portion of the photoelectric conversion panel.

FIG. 4 illustrates a cross-section of a portion of the photoelectric conversion panel 1 in the Y-direction. The photodiode 14 includes: a first lower electrode 14a, a second lower electrode 14b; an upper electrode 14c; and a photoelectric conversion layer 16. The photoelectric conversion layer 16 is provided between the second lower electrode 14b and the upper electrode 14c. For example, the scintillation light converted by the scintillator 2 enters the photoelectric conversion layer 16 from above of the drawing in FIG. 4. Note that FIG. 4 shows an example of a region including the TFTs 12c, the second protection circuits 12b, and the data terminals 12. A region including the TFTs 11c, the TFTs 112b (the first protection circuits J1b), and the gate terminals 11, and a region including the TFT 13c, the third protection circuit 13b, and the bias terminal 13 are the same as the region illustrated in FIG. 4. Hence, the illustrations and the descriptions of these regions shall be omitted.

<Configurations of TFT and Second Protection Circuit>

As illustrated in FIG. 4, the TFT 15 includes: the gate electrode 15a; a semiconductor active layer 15b; the source electrode 15c; and a drain electrode 15d. The drain electrode 15d and the second lower electrode 14b are connected together through the first lower electrode 14a. The data line 12a is connected to the source electrode 15c through a connecting electrode 112a. Moreover, the data line 12a is connected to a source electrode 32c of the TFT 12c through a connecting electrode 212a.

The TFT 12c includes: a gate electrode 32a; a semiconductor active layer 32b; the source electrode 32c; and a drain electrode 32d. The TFT 112b of the second protection circuit 12b includes: a gate electrode 31a; a semiconductor active layer 31b; a source electrode 31c; and a drain electrode 31d. The drain electrode 32d and the source electrode 31c are connected together. Moreover, the gate electrode 31a and the drain electrode 31d are connected together (short-circuited). Furthermore, the TFTs 11c and 13c are the same in configuration as the TFT 12c. The first protection circuit 11b and the third protection circuit 13b are the same in configuration as the second protection circuits 12b.

<Configuration of Each Layer>

Specifically, as illustrated in FIG. 4, the gate electrodes 15a, 31a, and 32a are formed, for example, in the same layer on the glass substrate 101. The glass substrate 101 is an insulative substrate. Each of the gate electrodes 15a, 31a, and 32a is a multilayer film containing, for example, tungsten (W) and tantalum nitride (TaN) as materials.

Moreover, the photoelectric conversion panel 1 includes a gate insulating film 102. The gate insulating film 102 is formed to cover the gate electrodes 15a, 31a, and 32a. For example, the gate insulating film 102 is formed of a multilayer including an upper insulating film made of silicon oxide ($SiO_2$) and a lower insulating film made of silicon nitride ($SiN_x$). The semiconductor active layer 15b, and the source electrode 15c and the drain electrode 15d both connected to the semiconductor active layer 15b, are formed above the gate electrode 15a through the gate insulating film 102. Moreover, the semiconductor active layer 31b, and the source electrode 31c and the drain electrode 31d both connected to the semiconductor active layer 31b, are formed above the gate electrode 31a through the gate insulating film 102. Furthermore, the semiconductor active layer 32b, and the source electrode 32c and the drain electrode 32d both connected to the semiconductor active layer 32b, are formed above the gate electrode 31a through the gate insulating film 102. In addition, the drain electrode 32d and the gate electrode 31a are connected together through a contact hole provided to the gate insulating film 102.

The semiconductor active layers 15b, 31b, and 32b are made of oxide semiconductor. The oxide semiconductor may contain, for example, $InGaO_3(ZnO)_5$, magnesium zinc oxide ($Mg_xZn_{1-x}O$), cadmium zinc oxide ($Cd_xZn_{1-x}O$), cadmium oxide (CdO), and InSnZnO (containing indium (In), tin (Sn), and zinc (Zn)). The oxide semiconductor may also be, for example, indium (In)-aluminum (Al)-zinc (Zn)-oxygen (O)-based oxide semiconductor. Alternatively, the oxide semiconductor may be amorphous semiconductor containing indium, (In), gallium (Ga), and zinc (Zn) in a predetermined ratio. Moreover, such materials as a "non-crystalline" material and a "crystalline (including polycrystalline, microcrystalline, and c-axis-oriented)" material can be applicable as the oxide semiconductor. If each of the semiconductor active layers 15b, 31b, and 32b is formed in a multilayer structure, the multilayer structure may include any given combination of the materials (may not exclude a particular combination pf the materials). In this embodiment, the semiconductor active layers 15b, 31b, and 31b are made of amorphous oxide semiconductor containing indium, (In), gallium (Ga), and zinc (Zn) in a predetermined ratio. When the TFT 15 is OFF, current leakage can be reduced further if the semiconductor active layer 15b is made of oxide semiconductor containing indium, (In), gallium (Ga), zinc (Zn), and oxygen (O) than if the semiconductor active layer 15b is made of amorphous silicon (a-Si). Such a feature can raise an S/N ratio and provide a sensor with high sensitivity.

Moreover, the source electrodes 15c, 31c, and 32c and the drain electrodes 15d, 31d, and 32d are provided in the same layer. Each of the source electrodes 15c, 31c, and 32c and the drain electrodes 15d, 31d, and 32d is formed in a three-layer structure in which, for example, a metal film made of aluminum (Al) is sandwiched between two metal films made of titanium (Ti). Thanks to such a configuration, the TFT 12c and the TFT 112b can be formed at the same production step, contributing to reduction of production steps.

As illustrated in FIG. 4, a first insulating film 103 (a passivation film) is provided above the gate insulating film 102, in order to cover the source electrodes 15c, 31c, and 32c, and the drain electrodes 15d, 31d, and 32d. Moreover, the first insulating film 103 is provided with a contact hole CH1, a contact hole CH4, and a contact hole CH5 respectively formed above the drain electrode 15d, the source electrode 15c, and the source electrode 32c. The first insulating film 103 is formed of, for example, silicon oxide ($SiO_2$).

Provided above the first insulating film 103 is a first organic film 104. The first organic film 104 is a planarization film for the TFTs 15 and 12c, and the second protection circuit 12b. Moreover, the first organic film 104 is provided with the contact hole CH1, the contact hole CH4, and the contact hole CH5 respectively formed above the drain electrode 15d, the source electrode 15c, and the source electrode 32c. The first organic film 104 is made of, for example, an acrylic material.

The first lower electrode 14a and the connecting electrodes 112a and 212a are formed on the first organic film 104. The first lower electrode 14a, a portion of which is formed in the contact hole CH1, connects the drain electrode 15d and the second lower electrode 14b together. The connecting electrode 112a, a portion of which is formed in the contact hole CH4, connects the source electrode 15c and the data line 12a together. The connecting electrode 212a, a portion of which is formed in the contact hole CH5, connects the source electrode 32c and the data line 12a together.

Each of the first lower electrode 14a and the connecting electrodes 112a and 212a is formed in a three-layer structure in which, for example, a metal film made of aluminum (Al) is sandwiched between two metal films made of titanium (Ti). Here, the first lower electrode 14a and the connecting electrode 112a contain aluminum. Aluminum is relatively low in resistance value such that resistance values of the first lower electrode 14a and the connecting electrode 112a are relatively low.

A first lower inorganic film 105a is formed to partially cover the first lower electrode 14a, the connecting electrodes 112a and 212a, and the first organic film 104. Moreover, the first lower inorganic film 105a is provided with a contact hole CH2 and a contact hole CH3 respectively formed above the connecting electrode 112a and the connecting electrode 212a.

The second lower electrode 14b is formed to partially cover the first lower electrode 14a. The second lower electrode 14b is formed of titanium (Ti).

The photoelectric conversion layer 16 is provided on the second lower electrode 14b. The photoelectric conversion layer 16 includes: an n-type non-crystalline semiconductor layer 161; an intrinsic non-crystalline semiconductor layer 162; and a p-type non-crystalline semiconductor layer 163, all of which are stacked one another in the stated order. The n-type semiconductor layer 161 is made of amorphous silicon doped with n-type impurities (e.g. phosphorus). The intrinsic non-crystalline semiconductor layer 162 is made of intrinsic amorphous silicon. The intrinsic non-crystalline semiconductor layer 162 is formed in contact with the n-type non-crystalline semiconductor layer 161. The p-type non-crystalline semiconductor layer 163 is made of amorphous silicon doped with p-type impurities (e.g. boron). The p-type non-crystalline semiconductor layer 163 is formed in contact with the intrinsic non-crystalline semiconductor layer 162.

The upper electrode 14c is formed above the photoelectric conversion layer 16. The upper electrode 14c is made of, for example, indium tin oxide (ITO).

A first upper inorganic film 105b is formed to at least partially cover the photodiode 14 and the first lower inorganic film 105a. Moreover, the first upper inorganic film 105b covers a portion of a top face of, and a side face of, the photodiode 14. For example, the first upper inorganic film 105b is made of, silicon nitride ($SiN_x$). Moreover, the first upper inorganic film 105b is provided with the contact hole CH2 and the contact hole CH3 respectively formed above the connecting electrode 112a and the connecting electrode 212a.

A second organic film 106, which is formed above the first organic film 104, at least partially covers the upper inorganic film 105b. Moreover, the second organic film 106, which covers the photodiode 14, is a planarization film to planarize a level difference formed of the photodiode 14. The second organic film 106 is made of, for example, the same material as that of the first organic film 104. Furthermore, the second organic film 106 is provided with the contact hole CH2 and the contact hole CH3 respectively formed above the connecting electrode 112a and the connecting electrode 212a.

The data line 12a is formed on the second organic film 106. The data terminal 12 is provided on the first upper inorganic film 105b. The data line 12a, a portion of which is formed in each of the contact holes CH2 and CH3, connects the TFT 15 and the TFT 12c together through the connecting electrodes 112a and 212a. The data line 12a and the data terminal 12 are made of, for example, ITO. The data terminal 12 is exposed.

A second inorganic film 107 is formed to cover the data line 12a and the data terminal 12.

A third inorganic film 108 is formed to cover the second inorganic film 107. The third organic film 108, which is formed above the second organic film 106, covers the second inorganic film 107. The third organic film 108 is made of, for example, the same material as that of the second organic film 106.

[Operation of X-Ray Imaging Device]

Described next is an operation of the X-ray imaging device 100. The bias voltage supplier 3c of the controller 3 applies a bias voltage (a negative voltage) to the bias lines 13a to apply the bias voltage to the photodiodes 14, and applies the bias voltage (an interrupting voltage) to each of the TFTs 11c, 12c and 13c. After that, each of the gate lines 11a in the photoelectric conversion panel 1 is sequentially and selectively supplied with a gate signal by the gate controller 3a. The TFTs 15 supplied with the gate signal turn ON. When the TFTs 15 turn ON, a signal (a data signal) based on the charges converted by the photodiodes 14 is output to the signal reader 3b through the data lines 12a. Here, the bias voltage (the interrupting voltage) is applied to the TFTs 11c, 12c, and 13c, such that neither the gate signal nor data signal runs toward the first protection circuits 11b, the second protection circuits 12b, and the third protection circuit 13b.

The embodiment described above is merely an example of the present disclosure. Hence, the present disclosure does not have to be limited to the above embodiment. Unless otherwise departing from the scope of the present disclosure, the embodiment can be implemented with appropriate modifications.

(1) The above embodiment describes an example in which the photoelectric conversion panel is applied to the X-ray imaging panel for the X-ray imaging device. However, the embodiment shall not be limited to this example. That is, the photoelectric conversion panel may be applied to an optical sensor panel other than for the X-ray.

(2) The above embodiment describes examples of materials of the layers (the films) included in the photoelectric conversion panel, and examples of how to produce the layers (the films). However, the embodiment shall not be limited to these examples. That is, the layers (the films) included in the photoelectric conversion panel may be formed in thicknesses, and formed of materials, other than the above examples. For example, the first organic film, the second organic film, and the third organic film may be made of different materials. Moreover, the first inorganic film, the second inorganic film, and the third inorganic film may be made of different materials. Furthermore, the TFTs may be made of a material other than IGZO.

(3) The above embodiment describes an example in which the bias lines are connected to the gate electrodes of the TFTs (the depletion thin-film transistors for protection), and the bias voltage is applied to the gate electrodes. However, the present disclosure shall not be limited to this example. That is, separately from the bias lines, special lines may be provided to the gate electrodes of the TFTs (the depletion thin-film transistors for protection), in order to apply the interrupting voltage.

(4) The above embodiment describes an example in which the TFTs (the depletion thin-film transistors for protection) are provided on the substrate between the second electro-static-discharge protection circuits and the pixel region provided with the pixels in plan view. However, the present disclosure shall not be limited to this example. That is, the thin-film transistors for protection may be provided in a position other than between the electro-static-discharge protection circuits and the pixel region.

(5) The above embodiment describes an example in which the TFTs (the depletion thin-film transistors for protection) and the other TFTs (the depletion transistors for the electro-static-discharge protection circuits) may be formed in the same layer and of the same material. However, the present disclosure shall not be limited to this example. That is, the TFTs (the depletion thin-film transistors for protection) and the other TFTs (the depletion transistors for the electro-static-discharge protection circuits) may be formed in different layers and of different materials.

(6) The above embodiment describes an example in which the first protection circuits, the second protection circuits, and the third protection circuit include depletion TFTs. However, the present disclosure shall not be limited to such an example. That is, the first protection circuits, the second protection circuits, and the third protection circuit may include enhancement TFTs.

(7) The above embodiment describes an example in which depletion TFTs are each provided to a corresponding one of the gate lines, the data lines, and the bias lines. However, the present disclosure shall not be limited to such an example. That is, the depletion TFTs may be provided only to some of the gate lines and the data lines.

The above photoelectric conversion panel may also be described below.

A photoelectric conversion panel according to a first configuration includes: a substrate; a gate line and a data line formed on the substrate; a pixel transistor connected to the gate line and the data line; a photoelectric conversion element connected to the pixel transistor; an electro-static-discharge protection circuit formed on the substrate and connected to a ground; a depletion transistor for protection connected between either the gate line or the data line and the electro-static-discharge protection circuit; and an interrupting voltage supply line configured to apply an interrupting voltage to a gate electrode of the depletion transistor for protection (the first configuration).

Thanks to the above first configuration, the depletion thin-film transistor for protection and the electro-static-discharge protection circuit can prevent an element in a pixel from breaking down by electro-static discharge during the production of the photoelectric conversion panel. In obtaining an image, an interrupting voltage is applied to the depletion thin-film transistor for protection. Hence, the depletion thin-film transistor for protection can block a signal from the gate line or the data line so that the signal does not enter the electro-static-discharge protection circuit, thereby contributing to a reduction in influence on a result of obtaining the image.

In the first configuration, the interrupting voltage supply line may include a bias line formed on the substrate (a second configuration).

Thanks to the above second configuration, the bias line, which is already available, can be used as the interrupting voltage supply line. Such a feature eliminates the need of a new line to be formed for application of an interrupting voltage to a gate electrode. Furthermore, the bias voltage to be applied to the bias line can be used as the interrupting voltage. Such a feature eliminates the need of a new power source circuit to be provided to supply the interrupting voltage.

In the first or the second configuration, the protection transistor may be disposed between a pixel region and the electro-static-discharge protection circuit on the substrate (a third configuration).

Thanks to the above third configuration, the substrate can be reduced in size, compared with a case where the thin-film transistor for protection is provided in a region on the substrate outside the electro-static-discharge protection circuit with respect to the pixel region.

In any one of the first to third configurations, the electro-static-discharge protection circuit may include a depletion transistor connected between the protection transistor and the ground (a fourth configuration).

If a depletion thin-film transistor is formed, the transistor formed in a region near the depletion thin-film transistor is a depletion transistor. Thus, it is difficult to form a transistor other than a depletion transistor. Thanks to the above fourth configuration, the thin-film transistor for protection and a transistor included in the electro-static-discharge protection circuit are both depletion transistors. Hence, the thin-film transistor for protection and the transistor included in the electro-static-discharge protection circuit can be disposed close to each other. Such a feature can reduce the size of the substrate provided with the thin-film transistor for protection and the transistor included in the electro-static-discharge protection circuit. Moreover, as to the depletion thin-film transistor, a threshold shift does not have to be controlled precisely. Compared with a case of forming a thin-film transistor without a threshold shift, the depletion thin-film transistor can be formed easily.

In the fourth configuration, a gate electrode of the transistor and a gate electrode of the depletion transistor in the electro-static-discharge protection circuit may be formed in a same layer and of a same material, a source electrode of the transistor and a source electrode of the depletion transistor in the electro-static-discharge protection circuit may be formed in a same layer and of a same material, and a drain electrode of the transistor and a drain electrode of the depletion transistor in the electro-static-discharge protection circuit may be formed in a same layer and of a same material (a fifth configuration).

Thanks to the above fifth configuration, the thin-film transistor for protection and the transistor included in the electro-static-discharge protection circuit can be formed at the same production step, contributing to reduction of production steps.

What is claimed is:

1. A photoelectric conversion panel, comprising:
   a substrate;
   a gate line and a data line formed on the substrate;
   a pixel transistor connected to the gate line and the data line;
   a photoelectric conversion element connected to the pixel transistor;
   an electro-static-discharge protection circuit formed on the substrate and connected to a ground, the electro-static-discharge protection circuit including a first depletion transistor;
   a second depletion transistor that is used for protection and that is connected between either the gate line and the electro-static-discharge protection circuit, or the data line and the electro-static-discharge protection circuit; and
   an interrupting voltage supply line configured to apply an interrupting voltage to a gate electrode of the second depletion transistor for protection, wherein
   the first depletion transistor is connected between the second depletion transistor for protection and the ground, and
   the pixel transistor, the first depletion transistor, and the second depletion transistor for protection are placed in a same layer.

2. The photoelectric conversion panel according to claim 1, wherein
   the interrupting voltage supply line includes a bias line formed on the substrate.

3. The photoelectric conversion panel according to claim 1, wherein
   the second depletion transistor for protection is disposed between a pixel region and the electro-static-discharge protection circuit on the substrate.

4. The photoelectric conversion panel according to claim 1, wherein a gate electrode of the first depletion transistor in the electro-static-discharge protection circuit and a gate electrode of the second depletion transistor for protection are formed in a same layer and of a same material, a source electrode of the first depletion transistor in the electro-static-discharge protection circuit and a source electrode of the second depletion transistor for protection are formed in a same layer and of a same material, and a drain electrode of the first depletion transistor in the electro-static-discharge protection circuit and a drain electrode of the second depletion transistor for protection are formed in a same layer and of a same material.

* * * * *